United States Patent [19]

Bahl

[11] Patent Number: 4,897,563
[45] Date of Patent: Jan. 30, 1990

[54] N-WAY MMIC REDUNDANT SWITCH
[75] Inventor: Inder J. Bahl, Roanoke, Va.
[73] Assignee: ITT Corporation, New York, N.Y.
[21] Appl. No.: 226,640
[22] Filed: Aug. 1, 1988
[51] Int. Cl.[4] .................. H03K 19/003; H03K 19/007
[52] U.S. Cl. ...................................... 307/441; 333/101; 307/241; 307/571; 307/584; 307/113; 307/244
[58] Field of Search ............... 307/219, 441, 239, 241, 307/242, 243, 244, 98, 112, 113, 571, 584; 333/101, 103

[56] References Cited

U.S. PATENT DOCUMENTS

| | | | |
|---|---|---|---|
| 3,860,872 | 1/1975 | Richardson et al. | 455/135 |
| 4,344,050 | 8/1982 | Callahan | 307/242 |
| 4,511,814 | 4/1985 | Matsuo et al. | 307/242 |
| 4,731,594 | 3/1988 | Kumar | 333/103 |
| 4,733,203 | 3/1988 | Ayasli | 333/103 |
| 4,810,911 | 3/1989 | Noguchi | 307/244 |
| 4,812,688 | 3/1989 | Chu et al. | 307/242 |

Primary Examiner—John S. Heyman
Assistant Examiner—Richard Roseen
Attorney, Agent, or Firm—Thomas N. Twomey; Mary C. Werner

[57] ABSTRACT

An N-way redundant switch is implemented through the use of serial and parallel redundancy for providing redundancy in both ON and OFF operating modes.

3 Claims, 8 Drawing Sheets

N-WAY MMIC REDUNDANT SWITCH

FIELD OF THE INVENTION

The present invention relates to high performance integrated circuits suitable for use in applications where reliability is important. More particularly, the present invention addresses circuit applications where reliability is enhanced by use of redundancy. The invention relates to a GaAs based circuit design approach which provides redundancy in order to obtain graceful degradation of circuit performance upon failure of individual components within the circuit, as well as increased yield of functional parts. According to the invention, redundancy is provided by designing the switch to include both series connected FET shunt and series connected series arms in the switch. A single pole double throw switch made according to the invention is capable of providing 1.3 dB insertion loss, return loss and isolation better than 20 dB and 35 dB, respectively over dc to 12 GHz, even if 25% of the FETs fail in each arm of the switch.

BACKGROUND AND SUMMARY OF THE INVENTION

In certain types of circuit applications it has become commonplace to provide for circuit redundancy. Typical of such applications are those where the national defense depends on the reliability of the circuit and those where human lives are dependent on proper circuit performance. For instance, many defense EW and ESM systems are designed to provide circuit redundancy. Additionally, such systems require the use of inherently reliable technologies, such as integrated circuitry rather than discrete components, to the maximum extent feasible. In airborne, spaceborne or remotely placed systems, an effective approach for circuit functions is required that provide the desired reliable performance with graceful degradation, in case of device failure, with cost as a major consideration. Monolithic technology provides inherent reliability relative to discrete components, is generally lower in cost due to the reduction in wire bonding and part count and also provides enhanced reproducibility since there are fewer opportunities to introduce variations into the end product.

Circuit applications requiring switching where redundancy is desired have not been satisfactorily implemented in GaAs technologies due to the absence of a feasible manner of implementing such circuits in GaAs integrated circuits. In the past, fast electronic switches using pin diodes have been designed and have been made redundant by using parallel or series diode pairs to replace single diodes. However, these switches require many discrete components, have high assembly costs, require exotic drivers, consume significant dc power, and allow the switching waveform to couple onto the rf signal path.

Figure 2:
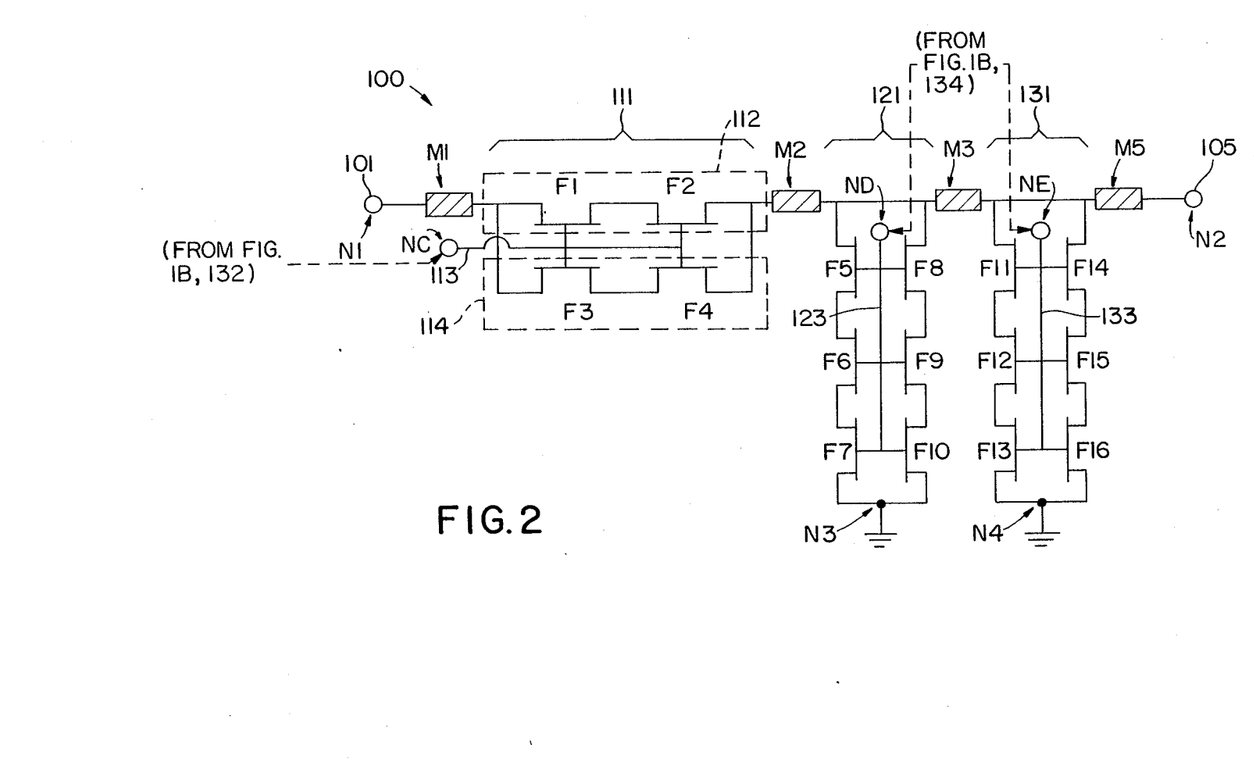
FIG. 2 illustrates a circuit schematic for a single pole single throw switch designed in accordance with the invention.
Figure 3:
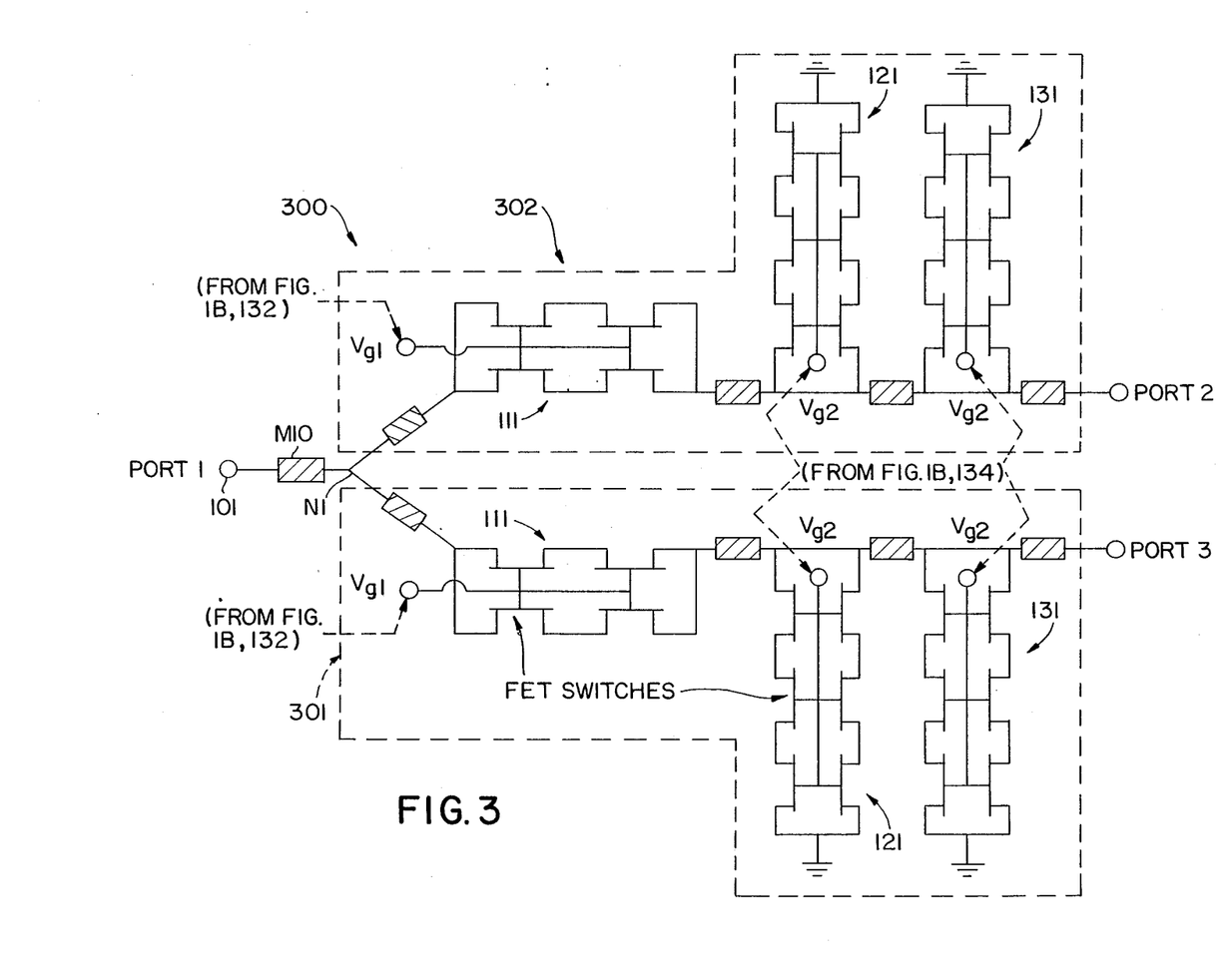
FIG. 3 illustrates a circuit schematic for a single pole double throw switch designed in accordance with the invention.
Figure 4:
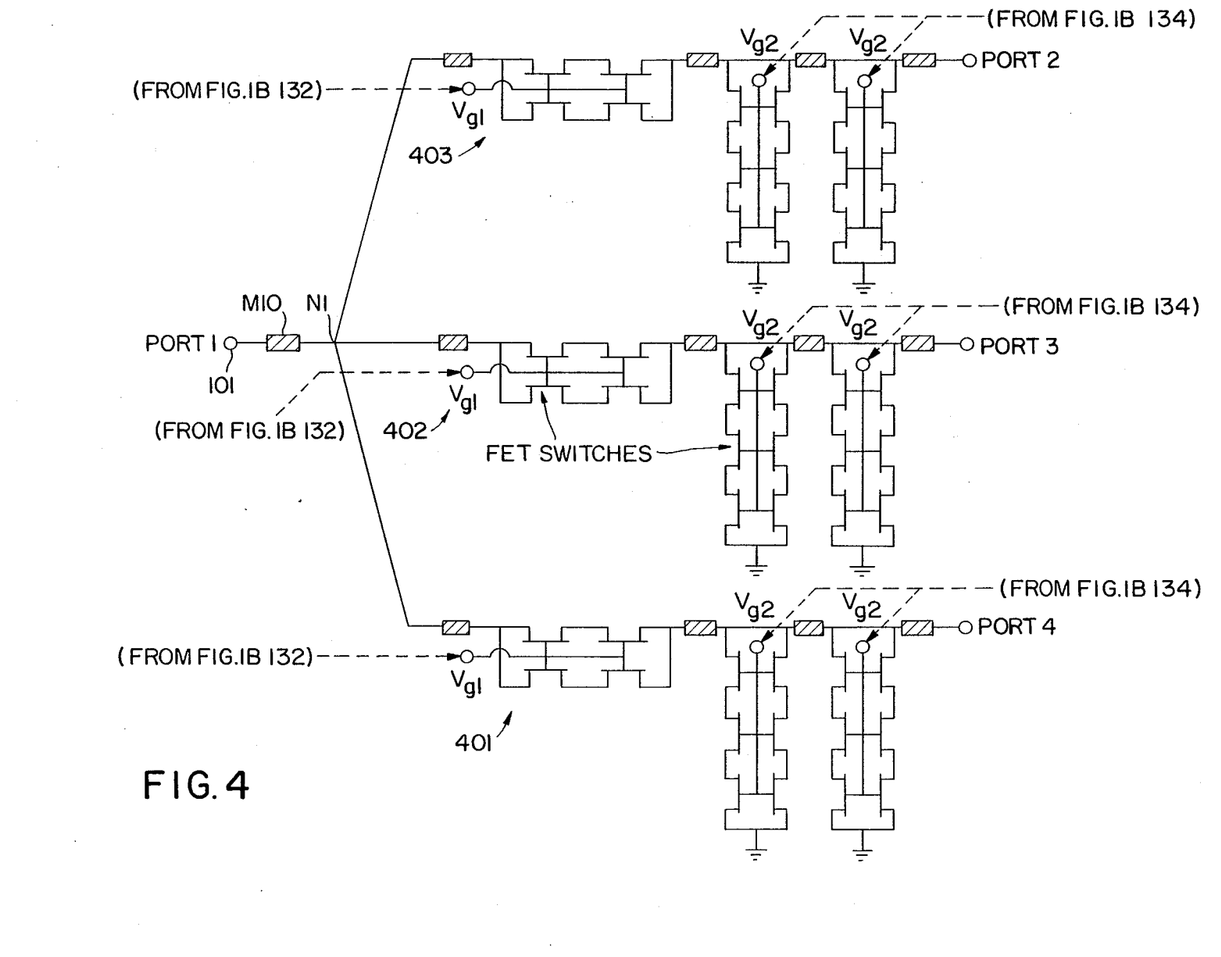
FIG. 4 illustrates a circuit schematic for a single pole triple throw switch designed in accordance with the invention.
Figure 5:
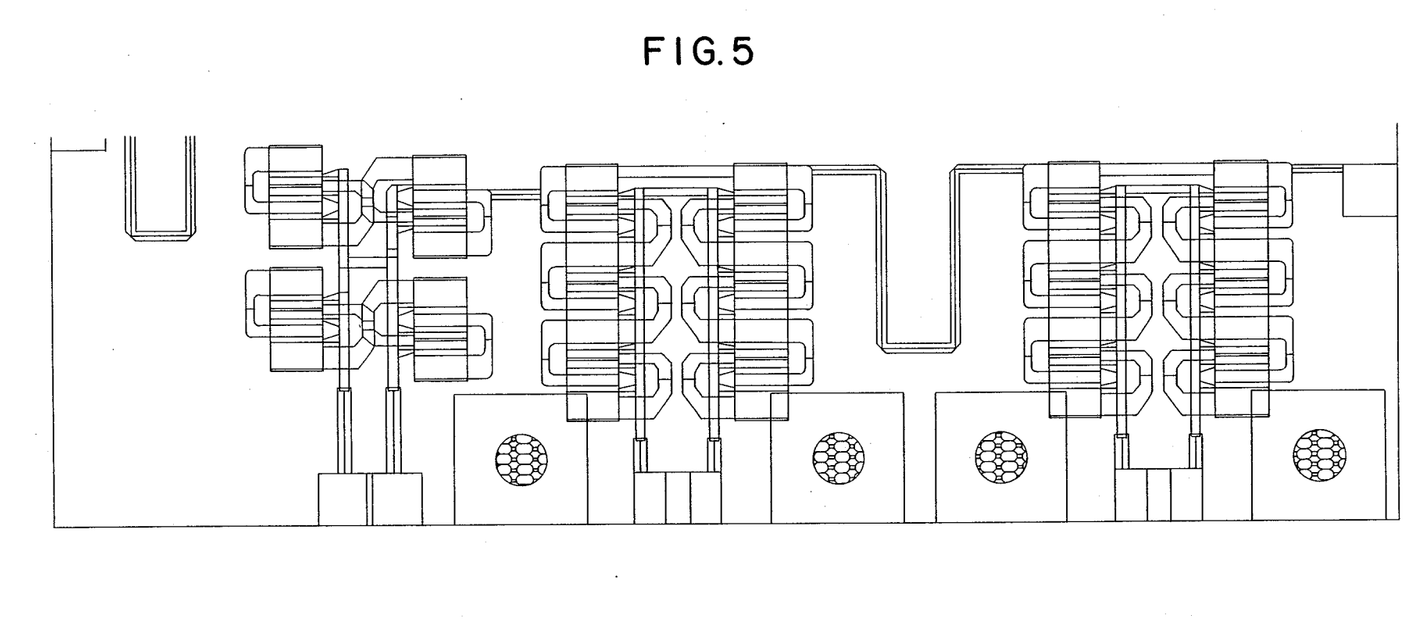
FIG. 5 illustrates the physical layout of a single pole double throw switch for manufacture in a GaAs based technology.

According to the present invention, redundancy is provided in a GaAs-based switch which is not dependent on the provision of pin diodes. N-way redundancy can be provided by employing GaAs MESFETs in a novel circuit design approach which is compatible with GaAs integrated circuit manufacturing technology. According to the novel design approach, GaAs MESFETs are arranged in series and shunt configurations in each series and shunt arm such that, if some of the MESFETs fail, the circuit still performs its intended function with very little degradation in the signal quality. A single pole single throw switch is shown in FIG. 2 which includes series connected MESFET shunt switching elements 121, 131 and series connected MESFET switching elements 111 to implement the redundancy feature. FIGS. 3 and 4 respectively illustrate single pole double throw and single pole triple throw switches including both series and shunt connected MESFETs. FIG. 5 illustrates the physical layout of the single pole double throw switch illustrated in FIG. 3.

DETAILED DESCRIPTION OF THE PREFERRED EMBODIMENTS

Redundancy to achieve high reliability and graceful degradation is often employed in military systems. In many redundant systems, parallel paths of components are provided which can be switched in case of failure in one of the signal paths. However, a failure in the switch will still destroy the system. Therefore, a redundant switch is required to enhance the system's reliability. The present invention provides a novel approach to realize an N-way redundant MESFET switch which can be fabricated with monolithic microwave integrated circuit (MMIC) technology. This switch design is redundant in the sense that it withstands the failure of one or more FETs while maintaining acceptable performance, greatly enhancing the expected reliability and yield of the switch.

Figure 1A:
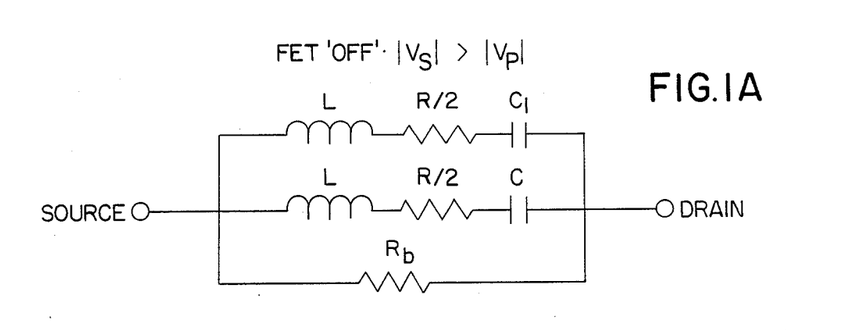
FIGS. 1A and C illustrate a RLC model equivalent circuit for a FET of the type employed in the description of the invention.
Figure 1B:
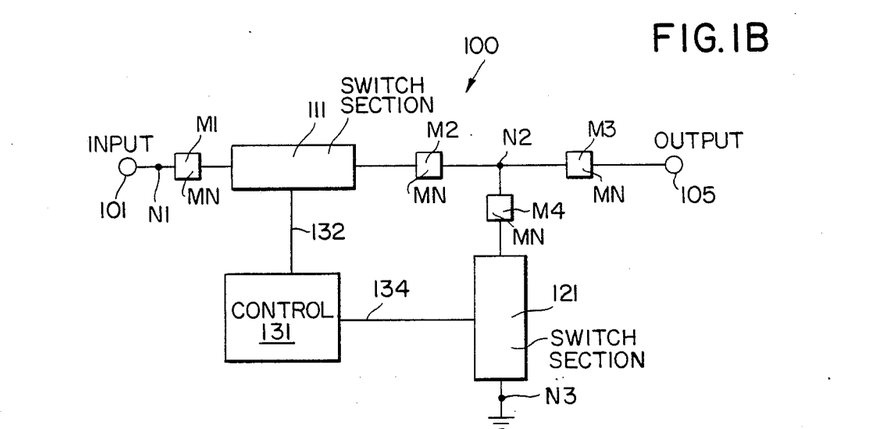
FIG. 1B illustrates a block diagram of an implementation of the invention.
Figure 1C:
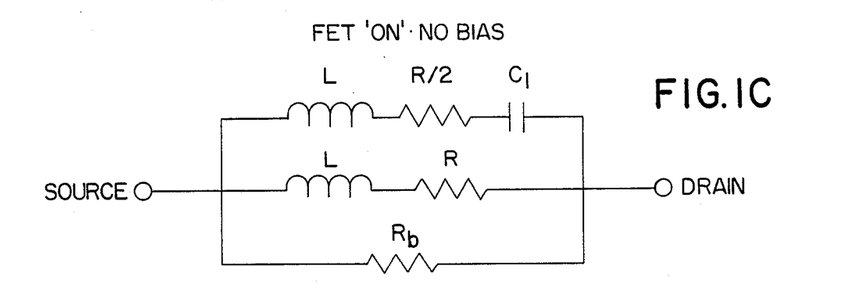

The FET is a three terminal device and makes an excellent switch between the drain and the source. The conductivity between source and drain is controlled by a voltage at the gate. The gate control voltage can be applied through large resistor, having resistance of, for instance, 1 to 5 K-Ohm for providing isolation between the gate terminal and its bias supply. The dc power consumption is negligible because the FET behaves as a passive element, i.e. no bias is applied to the drain or source so that the total dc power consumption results from the gate leakage current. Each switching FET is modeled with an equivalent circuit in either the ON (low resistance) or OFF (high resistance) states. FIGS. 1A and 1C show an equivalent RLC models for the FET. For various gate peripheries, RLC values are given in Table 1.

TABLE 1

Equivalent Circuit values for switching FETs having 0.8-μm gate length

| FET Size (μm) | R (Ω) | $R_b$ (Ω) | L (nH) | C (pF) | $C_1$ (pF) |
|---|---|---|---|---|---|
| 150 | 31 | 20k | 0.03 | 0.04 | 0.03 |
| 300 | 16 | 10k | 0.06 | 0.07 | 0.05 |
| 600 | 9 | 5k | 0.1 | 0.13 | 0.09 |

According to the invention, the switch circuit is designed to use series and series connected shunt combinations of switching FETs configured so that the circuit works with acceptable, although somewhat degraded performance, if some of the MESFETs fail. The FET gate peripheries are varied between 150 micrometers and 600 micrometers to obtain the best isolation, return loss, and the lowest insertion loss.

FIGS. 2–4 show schematics for single pole single throw (SPST), single pole double throw (SPDT), and single pole triple throw (SPTT) switches, respectively. Theoretically, switches larger than triple throw can be designed, however, the switch size of the MMIC must be limited for good yield. In view of the tradeoff between circuit size and production yield, the present description will be limited to descriptions of SPTT or smaller products.

TABLE 2.

SUMMARY OF PERFORMANCE FOR SPST, SPDT, AND SPTT REDUNDANT MMIC SWITCHES

| Performance Frequency (GHz) | SPST dc-12 | SPDT dc-12 | SPTT dc-12 |
|---|---|---|---|
| Max. Ins. Loss (dB) | 1.0 (1.2) | 1.2 (1.3) | 1.6 (1.7) |
| Min. Isolation (dB) | 35 (30) | 40 (40) | 40 (40) |
| Min. Ret. Loss (dB) | 18 (21) | 22 (24) | 13 (13) |

Figure 6:
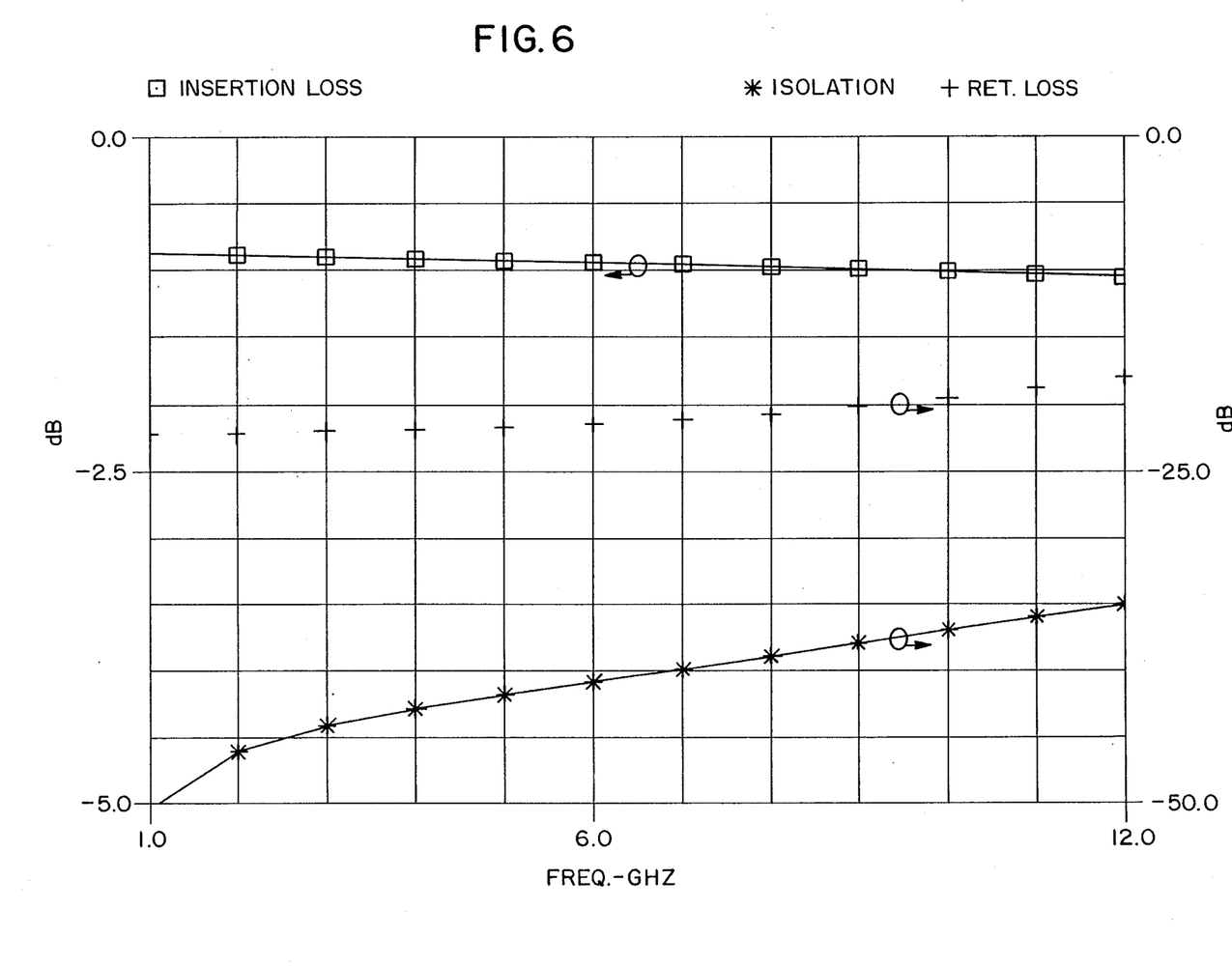
FIG. 6 is a plot showing the calculated performance of a single pole single throw switch designed in accordance with the invention.
Figure 7:
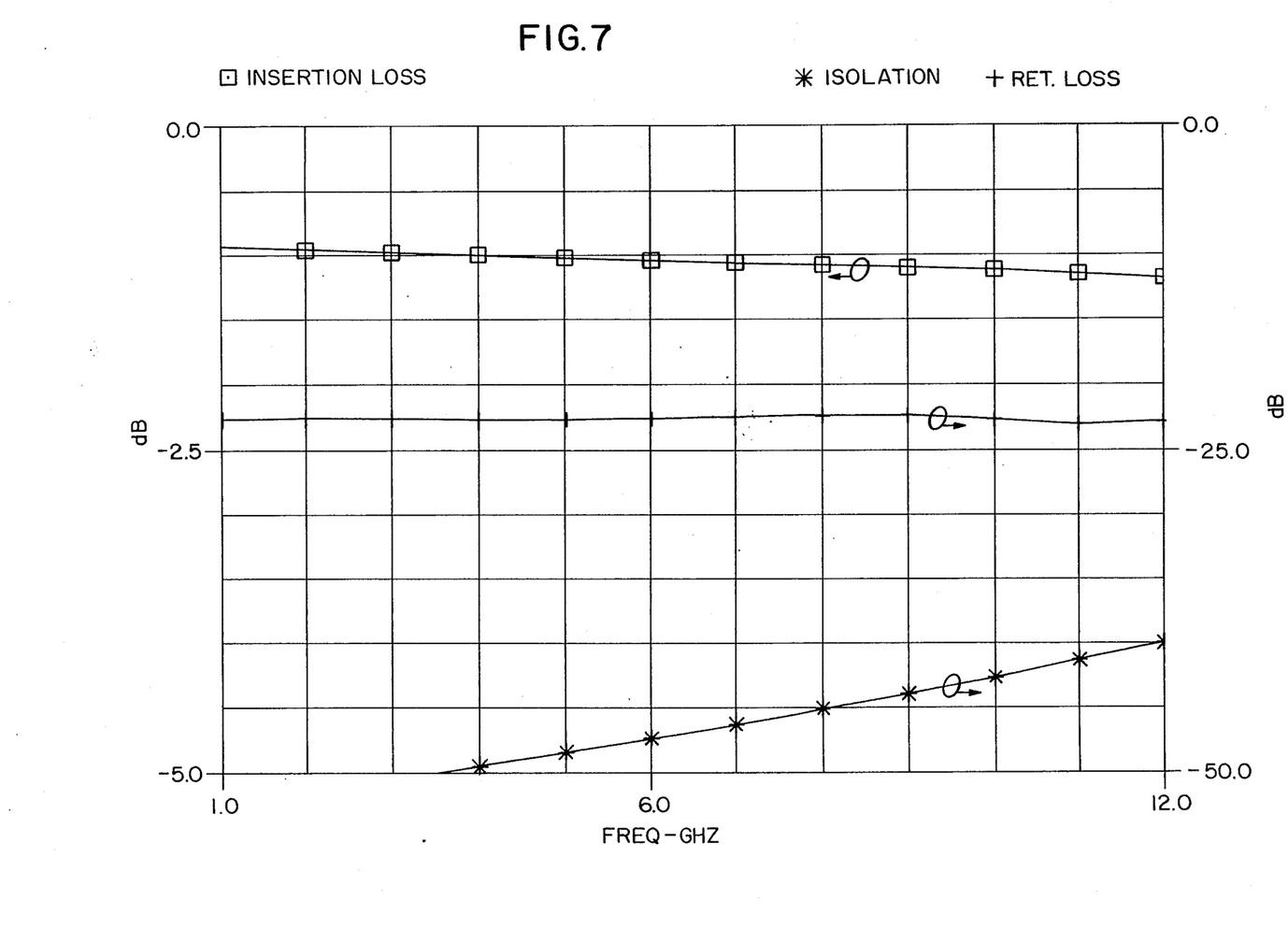
FIG. 7 is a plot showing the calculated performance of a single pole double throw switch designed in accordance with the invention.
Figure 8:
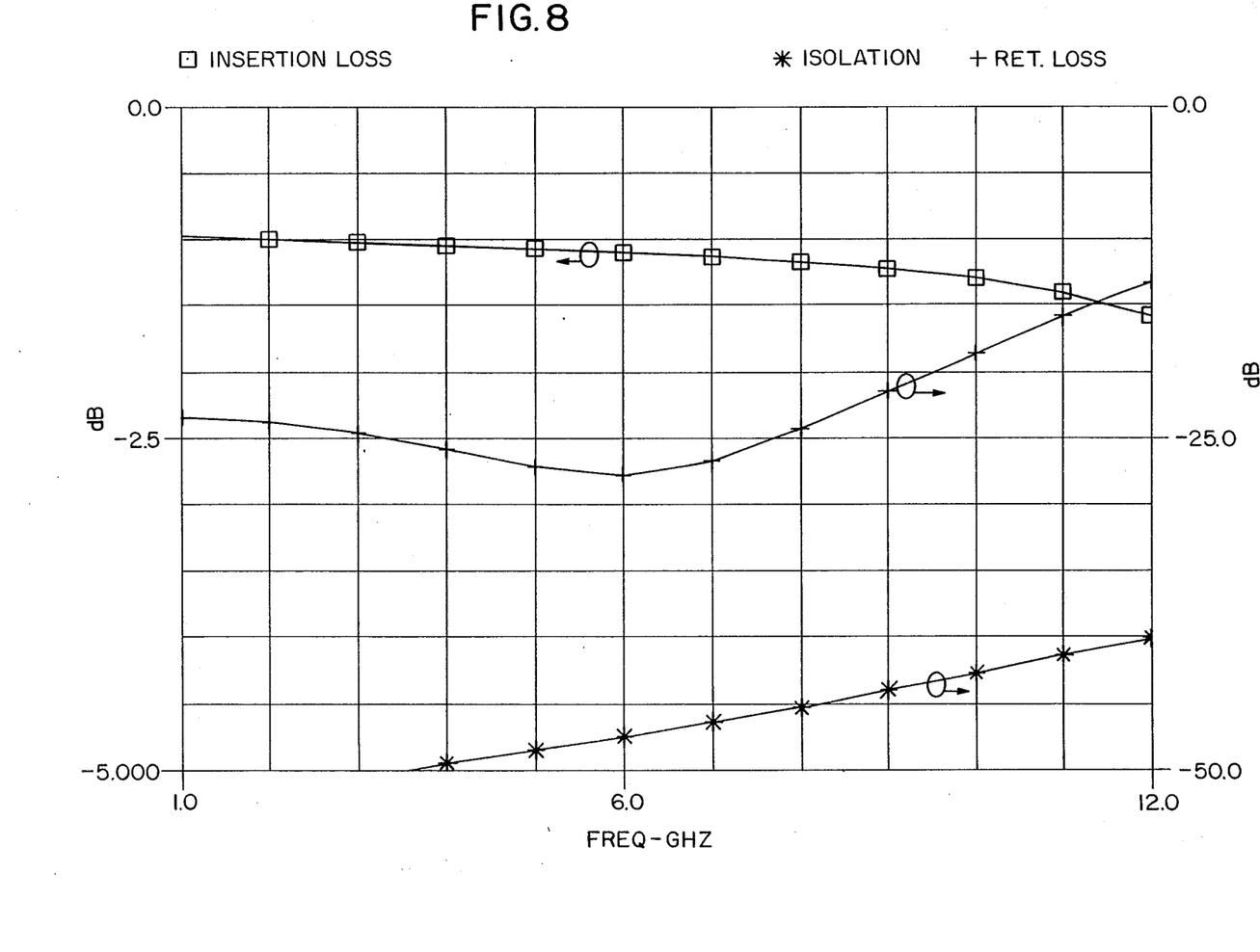
FIG. 8 is a plot showing the calculated performance of a single pole triple throw switch designed in accordance with the invention.

Table 2 summarizes the calculated performance as graphically illustrated in FIGS. 6–8 of the SPST, SPDT, and SPTT switches. This table shows that the switch performance promises to meet or exceed the performance of a nonredundant switch configured in the same manner. The insertion loss increases with the order of the switch but remains less than 2 dB in all cases. The isolation for all three switch configurations exceeds 35 dB and the return loss for the SPST and SPDT is greater than 18 dB while the SPTT has a worse case return loss of 13 dB. The values in parentheses on this table demonstrate the increased reliability. These values correspond to the worst case performance when 25% of the FETs in each arm are shorted at random. The performance degrades only slightly as the insertion loss remains below 2 dB and the return loss maintains its initial value or improves. Additionally, the SPDT and SPTT switches maintain their initial isolation value while the isolation of the SPST switch only degrades by 5 dB. The reliability analysis of a redundant switch was also carried out. The analysis predicted that the MTBF of the redundant switch (SPST) is on the order of 100 times the MTBF of a simple 2 FET switch.

The operation of the N-way redundant switch can be explained by reference to FIG. 1B where the switch 100 receives an input signal at input terminal 101. Matching network M1 (matching networks are labeled MN in FIG. 1B) provides impedance matching and passes the input signal to the first section 111 of the switch. Section 111 may be ON in which case the input signal is provided via matching network M2, to N2 which is coupled, via optional matching circuit M3 to output terminal 105. If section 111 is OFF, the input signal is blocked by section 111 and is not passed to output 105. A switch control signal is provided to section 111 from control circuit 131. The control signal on line 132 causes switch section 111 to operate in either the ON (conductive) state or the OFF (non-conductive) state.

A second switch section 121 is connected between node N2 and node N3, which is at ground. Matching circuit M4 is provided for impedance matching. A second control signal is provided to section 121 from control circuit 131 via line 134. Section 121 is operated in either the ON or OFF state to selectively ground the output 105. In operation of the switch 100, one section (111 or 121) is ON while the other is OFF. This causes the output 105 to be selectively coupled to either the input 101, when 111 is ON while 121 is OFF, or to the grounded node N3, when 111 is OFF while 121 is ON. Control circuit 131 can operate to provide the first and second control signals with opposite polarity to ensure the appropriate inverse operation of the first and second section 111, 121 of switch 100.

Control circuit 131 may be of any convenient design capable of providing control signals where the signal to one section is at an ON bias and the signal to the other section is an OFF bias.

Referring to FIG. 2, input 101 at node N1 is coupled via optional impedance matching circuit M1 to first section 111 of switch 100. Section 111 includes a first branch 112 having FETs F1 and F2 connected in series, source to drain, between node N1 and node N2. A second branch 114 includes FETs F3 and F4 connected in series, source to drain, between nodes N1 and N2, the second branch 114 being parallel with the first branch 112. The gates of FETs F1, F2, F3 and F4 are all connected together and coupled, via line 113, to a control node NC for receipt via line 132 of the first control signal generated by control circuit 131 shown in FIG. 1B.

Redundancy is provided in this section 11 such that if any one of FETs F1, F2, F3 or F4 becomes inoperative, only the branch 112 or 114 in which the inoperative FET resides will be disabled from ideal operation. For instance, if FET F1 fails such that it is always conductive, FET F2 will still be operative to turn branch 112 OFF and ON pursuant to the control signal on line 113. Should F1 fail such that it is always non-conductive, section 111 will operate correctly due to branch 114. In this situation, branch 112 is effectively removed from the circuit. Thus, by having FETs in series in each branch and having branches in parallel in each section, failure of any individual FET is not destructive insofar as operability of the section is concerned. Moreover, FET failures of less than all FETs in each branch will allow each such branch to remain operative if the mode of failure causes an undesired ON condition in the failed or defective FETs. Alternatively, if the failure mode of the FETs causes an undesired OFF condition, the section will continue to operate until there has been a failure in every branch.

The second section 121 of switch 100 includes two parallel branches the first made up of FETs F5, F6 and F7 connected in series to couple nodes N2 and N3, with optional matching circuits M3 and M5 shown in FIG. 2 between FET F5 and node N2. The second branch includes FETs F8, F9 and F10 coupled in series between nodes N2 and N3. As with section 111, the FETs of section 121 have their gates connected together, in this section at node ND. Line 123 provides the intergate connection to node ND.

The third section 131 includes first and second parallel branches made up of FETs F11, F12, F13 and F14, F15, F16, respectively. The branches, as in section 121, couple node N2 to ground, in this case at node N4. The gates are connected, via line 133 to node NE. The provision of a third section 131 in parallel with the second section 121, provides additional redundancy to the overall switch 100. Additionally, the provision of three FETs in each branch provides greater immunity from failure due to shorted FETs than does the arrangement in section 111 since three FETs in a row would become shorted less frequently than would be probable if only two FETs were provided in series as exemplified in section 111.

The optional impedance matching circuitry M1, M2, M3, M5 is available to optimize circuit performance when the switch is to be utilized in an application where signal quality is important. This will generally be the case where redundancy is employed.

FIG. 3 illustrates a single pole double throw switch 300 having first arm 301 and second arm 302. Each of arms 301, 302 is illustrated as employing three sections 111, 121 and 131 having the same configuration as described with respect to FIG. 2. The arms 301, 302 have a common input node N1 and an impedance matching element M10 between node N1 and input terminal 101.

FIG. 4 illustrates a single pole triple throw switch 400 having first arm 401, second arm 402 and third arm 403. Each arm is similar to the SPST arrangement illustrated in FIG. 2, and as in FIG. 3, node N1 is a common input node into each arm. Matching circuit M10 provides impedance matching for the switch input terminal 101.

While the present invention has been described with respect to various specific implementations of the invention, it is to be understood that the invention resides in the novel design approach rather than in the specific implementation described in this application. It is intended that the patent shall cover not only those implementations specifically disclosed, but also all obvious modifications and extensions thereof as well as the entire range of implementations encompassed by the claims appended hereto and the equivalents thereof.

What is claimed is:

1. A redundant switch comprising a plurality of FETs, each FET including a source, a gate and a drain, said switch comprising:
   first, second and third sections, each section having first, second, third and fourth FETs having gates connected to a central node of said section, said first and second FETs of each section having drains connected to the sources of said third and fourth FETs respectively of said section, said first and second FETs of each section having their sources connected to a first node of said section and said third and fourth FETs of each section having their drains connected to a second node of said section;
   said first section having a first input terminal connected to said first node for receiving a first input signal and having a second input terminal connected to said central node for receiving a second input signal;
   said second section having a third input terminal connected to said central node and having its first node connected to said second node of said first section, and having its second node connected to ground;
   said third section having a fourth input terminal connected to said central node and having its first node connected to said first node of said second section and to an output terminal, and having its second node connected to ground.

2. A redundant switch comprising a plurality of FETs, each FET including a source, a gate and a drain, said switch comprising:
   first, second and third sections, each including first and second pluralities of FETs, said first plurality of FETs in each section being connected in a source to drain chain between a first node of said section and a second node of said section, said second plurality of FETs in each section being connected in a source to drain chain between said first node and said second node, and the gates of said first and second pluralities of FETs of each section being connected to a central node of said section;
   a first input terminal connected to said first node of said first section for providing an information signal to said switch;
   a second input terminal connected to said central node of said first section for providing gate bias for said first section;
   third and fourth input terminals connected to said central nodes of said second and third sections respectively for providing gate bias for said second and third sections respectively;
   said second node of said first section being coupled to said first nodes of said second and third sections and to an output terminal;
   said second nodes of said second and third sections being grounded.

3. A redundant switch comprising a plurality of FETs, each FET including a source, a gate and a drain, said switch comprising:
   a first section including first and second branches, each said branch including first and second FETs connected in series between first and second nodes of said section, said first node being coupled to a signal input terminal, said second node being coupled to a signal output terminal, said first section further including a central node coupled to receive a first control signal and provide said first control signal to the gates of said first and second FETs in said first and second branches to select conductive or non-conductive operation of said FETs;
   a second section including first and second branches, each said branch including first and second FETs connected in series between first and second nodes of said section, said first node being coupled to said signal output terminal, said second node being coupled to ground, said second section further including a central node coupled to receive a second control signal and provide said second control signal to the gates, said first and second FETs in said first and second branches to select conductive or non-conductive operation of said FETs, said FETs of said second section being rendered conductive when said FETs of said first section are non-conductive and said FETs of said second section being rendered non-conducive when said FETs of said first section are conductive.

* * * * *